United States Patent
Kupershmidt et al.

(10) Patent No.: US 10,034,098 B2
(45) Date of Patent: Jul. 24, 2018

(54) GENERATION OF AUDIO AND ULTRASONIC SIGNALS AND MEASURING ULTRASONIC RESPONSE IN DUAL-MODE MEMS SPEAKER

(71) Applicant: DSP GROUP LTD., Herzeliya (IL)

(72) Inventors: Haim Kupershmidt, Or Yehuda (IL); Lior Blanka, Rosh Haayin (IL)

(73) Assignee: DSP GROUP LTD., Herzliya (IL)

( * ) Notice: Subject to any disclaimer, the term of this patent is extended or adjusted under 35 U.S.C. 154(b) by 0 days.

(21) Appl. No.: 15/244,058

(22) Filed: Aug. 23, 2016

(65) Prior Publication Data

US 2017/0064457 A1 Mar. 2, 2017

Related U.S. Application Data

(63) Continuation-in-part of application No. 15/075,246, filed on Mar. 21, 2016, now Pat. No. 9,774,959.

(60) Provisional application No. 62/208,725, filed on Aug. 23, 2015, provisional application No. 62/137,835, filed on Mar. 25, 2015.

(51) Int. Cl.
| | |
|---|---|
| *H04R 25/00* | (2006.01) |
| *H04R 19/02* | (2006.01) |
| *B81B 3/00* | (2006.01) |
| *H04R 17/00* | (2006.01) |

(52) U.S. Cl.
CPC ........... *H04R 19/02* (2013.01); *B81B 3/0021* (2013.01); *H04R 17/00* (2013.01); *B81B 2201/0257* (2013.01); *B81B 2201/0271* (2013.01); *H04R 2201/003* (2013.01); *H04R 2217/03* (2013.01)

(58) Field of Classification Search
CPC combination set(s) only.
See application file for complete search history.

(56) References Cited

U.S. PATENT DOCUMENTS

| | | | |
|---|---|---|---|
| 7,391,872 B2 * | 6/2008 | Pompei | B06B 1/0292 367/119 |
| 8,861,752 B2 * | 10/2014 | Margalit | H04R 1/22 381/152 |
| 2016/0360320 A1 | 12/2016 | Margalit | |
| 2016/0360321 A1 | 12/2016 | Margalit | |

* cited by examiner

*Primary Examiner* — Amir Etesam
(74) *Attorney, Agent, or Firm* — Reches Patents

(57) ABSTRACT

A MEMS speaker that includes a control unit and multiple MEMS elements that include a membrane positioned in a first plane, a blind that is positioned in a second plane and a shutter that is positioned in a third plane. The control unit is configured to control the multiple MEMS elements to operate in an audio output mode or an ultrasonic output mode. The MEMS speaker is configured, when operating in the ultrasonic output mode, to oscillate at least one of the membrane, blind and shutter thereby generating an ultrasonic signal without audio-modulating the ultrasonic signal. The MEMS speaker is configured, when operating in the audio output mode, to oscillate the membrane thereby generating the ultrasonic signal and oscillate at least one of the shutter and the blind thereby modulating the ultrasonic acoustic signal to generate an audio signal.

12 Claims, 17 Drawing Sheets

GENERATION OF AUDIO AND ULTRASONIC SIGNALS AND MEASURING ULTRASONIC RESPONSE IN DUAL-MODE MEMS SPEAKER

CROSS REFERENCE TO RELATED APPLICATIONS

This application claims the priority of provisional patent Ser. No. 62/208,725 filing date Aug. 23, 2015 which is incorporated herein by reference.

This application is a continuation in part of U.S. patent application Ser. No. 15/075,246 filing date Mar. 21, 2016 which claims priority from U.S. provisional patent 62/137,835 fling date Mar. 25, 2015—both patent applications are incorporated herein by reference.

BACKGROUND

Both audio and ultrasonic technologies are being used in mobile electronic devices, such as smartphones and tablets. On top of the "classical" use of audio speakers to enable hands-free operation, consumers today expect higher-quality audio and video performance, and thus higher performance requirements from audio speakers in smartphones and wearable devices. Ultrasonic-enabled applications include stylus-based inputs either on-screen or on a nearby desktop, touch-less interfaces such as gestures to perform commands, proximity sensors etc.

SUMMARY

There may be provided a MEMS speaker that includes a control unit and multiple MEMS elements that include a membrane positioned in a first plane, a blind that is positioned in a second plane and a shutter that is positioned in a third plane. The control unit may be configured to control the multiple MEMS elements to operate in an audio output mode or an ultrasonic output mode. The MEMS speaker may be configured, when operating in the ultrasonic output mode, to oscillate at least one of the membrane, blind and shutter thereby generating an ultrasonic signal without audio-modulating the ultrasonic signal. The MEMS speaker may be configured, when operating in the audio output mode, to oscillate the membrane thereby generating the ultrasonic signal and oscillate at least one of the shutter and the blind thereby modulating the ultrasonic acoustic signal to generate an audio signal.

The MEMS speaker may include a detector that is coupled to a MEMS element of the multiple MEMS elements; wherein the detector may be configured to sense ultrasonic vibrations of the MEMS element, during a detection period during which the MEMS speaker is not induced to vibrate by the control unit.

The MEMS element may be configured to vibrate as a result of a reception of an ultrasonic echo; wherein the MEMS speaker may be configured to output an ultrasonic probe signal during a transmission period that preceded the detection period; and wherein the ultrasonic echo results from the transmission of ultrasonic probe signal.

The MEMS speaker may include a detector that is coupled to a plurality of MEMS elements of the multiple MEMS elements; wherein the detector may be configured to sense ultrasonic vibrations of each one of the plurality of MEMS elements, during a detection period during which the MEMS speaker is not induced to vibrate by the control unit.

The MEMS speaker may be configured, when operating in the audio output mode, to send a shutter control signal for oscillating the shutter and send a blind control signal for oscillating the blind.

The control unit may be configured, when operating in the audio output mode, to receive an input signal that represents the audio signal, and to control one or more of the multiple MEMS elements based on the input signal.

There may be provided a method for generating an output signal by a micro-electro-mechanical system (MEMS) speaker, the method may include: oscillating, when operating in an ultrasonic output mode, at least one MEMS element of multiple MEMS elements thereby generating an ultrasonic signal without audio-modulating the ultrasonic signal; wherein the multiple MEMS elements may include a membrane that is positioned in a first plane, a blind that is positioned in a second plane and a shutter that is positioned in a third plane; and oscillating, wherein operating in the audio output mode, the membrane thereby generating the ultrasonic signal and oscillating at least one of the shutter and the blind thereby modulating the ultrasonic acoustic signal to generate an audio signal.

The method may include sensing, by a detector that is coupled to a MEMS element of the multiple MEMS elements, ultrasonic vibrations of the MEMS element, during a detection period during which the MEMS speaker is not induced to vibrate by the control unit.

The MEMS element vibrates as a result of a reception of an ultrasonic echo; wherein the method may include outputting, by the MEMS speaker, an ultrasonic probe signal during a transmission period that preceded the detection period; and wherein the ultrasonic echo results from the transmission of ultrasonic probe signal.

The method may include sensing, by a detector that is coupled to a plurality of MEMS elements of the multiple MEMS elements, ultrasonic vibrations of each one of the plurality of MEMS elements, during a detection period during which the MEMS speaker is not induced to vibrate by the control unit.

The method may include sending, by the MEMS speaker and when operating in the audio output mode, a shutter control signal for oscillating the shutter and sending a blind control signal for oscillating the blind.

The method may include receiving, by the control unit and when operating in the audio output mode, an input signal that represents the audio signal, and controlling one or more of the multiple MEMS elements based on the input signal.

There may be provided a micro-electro-mechanical system (MEMS) speaker that may include: a membrane positioned in a first plane; and a control unit that may be configured to control the membrane to operate in an audio output mode or an ultrasonic output mode;

wherein the control unit may be configured, when operating in the ultrasonic output mode, to oscillate the membrane thereby generating an ultrasonic signal without audio-modulating the ultrasonic signal; and wherein the control unit may be configured, when operating in the audio output mode, to oscillate the membrane thereby generating an audio signal. Ultrasound oscillating may require to operate the membrane at higher modes of operation (higher oscillation frequencies).

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1A:
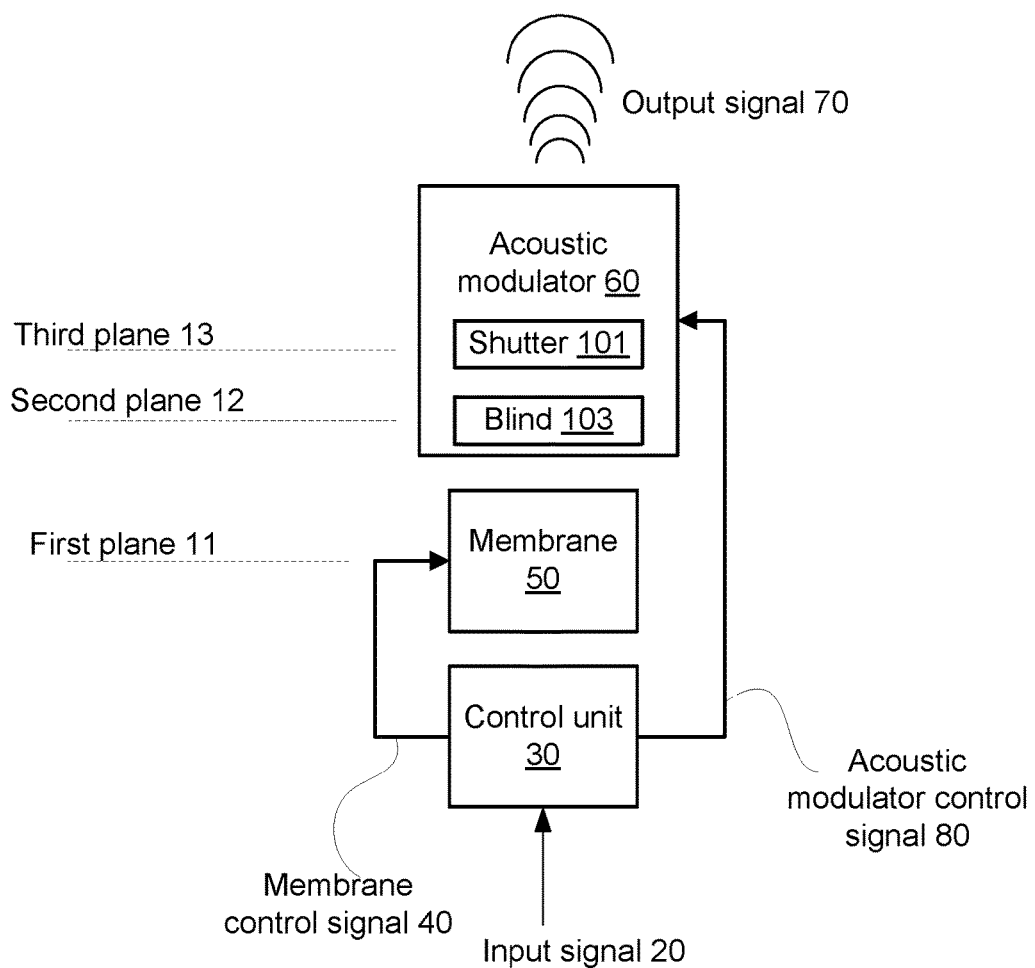
FIG. 1A illustrates a MEMS speaker according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Any reference in the specification to a system should be applied mutatis mutandis to a method that can be executed by the system.

Because the illustrated at least one embodiment of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

There is provided a microelectromechanical systems (MEMS) speaker that may output audio and ultrasound signals. The MEMS speaker may include a membrane, a blind and a shutter that are spaced apart from each other—they may be located in different planes.

There is provided a MEMS speaker that is configured to generate audio and/or ultrasonic signals for dual-mode operation on a MEMS speaker.

The MEMS speaker can be included in mobile devices such as smartphones, iPads, smart watches, wearable devices, laptops and alike.

The MEMS speaker can be used to support high-quality audio generation as required by today's mobile and wearable devices, as well as ultrasonic-enabled applications such as: stylus-based inputs either on-screen or on a nearby desktop, touch-less interfaces such as gestures to perform commands, proximity sensor etc.

Using a MEMS speaker that generates audio and/or Ultrasonic signals, can potentially reduce space constraints, reduce costs, and improve power efficiency.

The MEMS speaker can generate audio signals and ultrasonic signals at spaced apart time periods or concurrently.

The MEMS speaker can output an audio signal by generating an ultrasonic signals and modulating the ultrasonic signal to generate the audio signal. When Audio is desired, the ultrasonic signal may be generated as a by-product of the MEMS speaker operation.

The MEMS speaker may generate the ultrasound signal without the audio, either by vibrating a membrane only or a shutter only.

The MEMS speaker may include a detector for detecting ultrasonic oscillations of at least one of the membrane, blind and shutter. These ultrasonic oscillations may be detected while the membrane, blind and shutter are not induced to oscillate by the control unit of the MEMS speaker.

The ultrasonic oscillations may result from a reception of an ultrasonic echo by the MEMS speaker. The echo may be an echo of an ultrasonic probe signal previously transmitter by the MEMS speaker.

The MEMS signals may generate multiple ultrasonic probe signals (multiple bursts) and then sense the ultrasonic oscillations of at least one of the membrane, blind and shutter.

The transmission of the multiple ultrasonic probe signals may be executed while the MEMS speaker acts as a proximity sensor, as a distance measurement device, an ultrasonic radar, and the like There is obtained a space savings by using a single device instead of two, or, when including the detector, even three devices. In addition, the single MEMS speaker is considerably smaller than a standard audio speaker: approximately a few millimeters vs. 1.5 centimeter.

There may be obtained cost savings of a single device vs. two devices.

There may be obtained power efficiency of a single device vs. two devices.

FIG. 1A illustrates MEMS speaker 10 that includes control unit 30 and multiple MEMS elements such as (a) membrane 50 positioned in a first plane 11, (b) blind 103 that is positioned in a second plane 12 and (c) shutter 101 that is positioned in a third plane 13.

Control unit 30 is configured to control the multiple MEMS elements—during an audio output mode and during an ultrasonic output mode.

Control unit 30 may receive instructions or command from a user or another device to determine when to operate the multiple MEMS elements in the audio output mode and when to operate in the ultrasonic output mode. The controlling may be responsive to a schedule or timing information fed to the control unit 30.

Control unit 30 may control the multiple MEMS elements in response to an application that is executed by a mobile device that includes the MEMS speaker.

When MEMS speaker 10 is required to output an audio signal (for example an audio signal that is fed by a media player application)—control unit 30 may activate the multiple MEMS elements at an audio output mode. When MEMS speaker 10 is required to act as a proximity sensor—the control unit 30 may activate the multiple MEMS elements in alternating ultrasonic output mode and detection mode.

MEMS speaker 10 is configured, when operating in the ultrasonic output mode, to oscillate at least one of the membrane 50, blind 103 and shutter 101 thereby generating an ultrasonic signal without audio-modulating the ultrasonic signal. Acoustic modulation includes modulating an ultrasonic signal to generate (and output) an audio signal.

The MEMS speaker 10 is configured, when operating in the audio output mode, to oscillate the membrane 50 thereby generating the ultrasonic signal and oscillate at least one of the shutter 101 and the blind 103 thereby modulating the ultrasonic acoustic signal to generate an audio signal. When operating in the audio output mode the shutter 101 and the blind 103 form an acoustic modulator 60. The membrane 50, shutter 101 and blind 103 may oscillate at the same direction. Alternatively, the membrane 50 may oscillate at a first direction that is oriented (and even normal) to the direction of the oscillation of the blind 101 and/or shutter 101. The blind may be static or may oscillate.

FIG. 1A illustrates an output signal 70 that is outputted from MEMS speaker 10. The output signal may be an audio signal and/or an ultrasonic signal.

Control unit 30 may receive an input signal 20. The input signal 20 may represent the output signal 70 to be outputted by MEMS speaker 10. The input signal 20 may be a digital or analog signal.

Control unit 30 may output a membrane control signal 40 for controlling (for example oscillating) the membrane 50. Control unit 30 may output an acoustic modulator control signal 80 for controlling the acoustic modulator 60.

When operating in the audio output mode membrane control signal 40 is at an ultra sound frequency which is modulated by the input signal 20. A typical ultrasound frequency may be in the 100 to 500 KHz range. Membrane control signal 40 is applied to the membrane 50. This causes the membrane to oscillate or vibrate in sympathy with the stimulus frequency. The ultrasonic wave resulting from the membrane vibrations is modulated by the acoustic modulator 60. The action of the acoustic modulator 60 is to obstruct and open the air flow from the membrane 50. The acoustic modulator control signal 80 from control unit 30 is at the same ultrasonic frequency used to stimulate the membrane 50, but in this case it is not modulated by the audio signal. It can be shown that the resulting output signal 70 can be made to have a strong component at the audio signal frequencies, corresponding to the input signal 20.

Due to the fact that air pressure from a given membrane rises with frequency to the power of two, the performance of such a speaker is such that the low frequencies and hence the overall quality of the audio performance is improved over a conventional speaker design. The interface and control block generates the actuation voltages required in order to vibrate the membrane and the shutter. These actuation voltages depend on the specific type of the actuation scheme. For example, for electrostatic actuation these are typically in the order of 100.

Figure 1B:
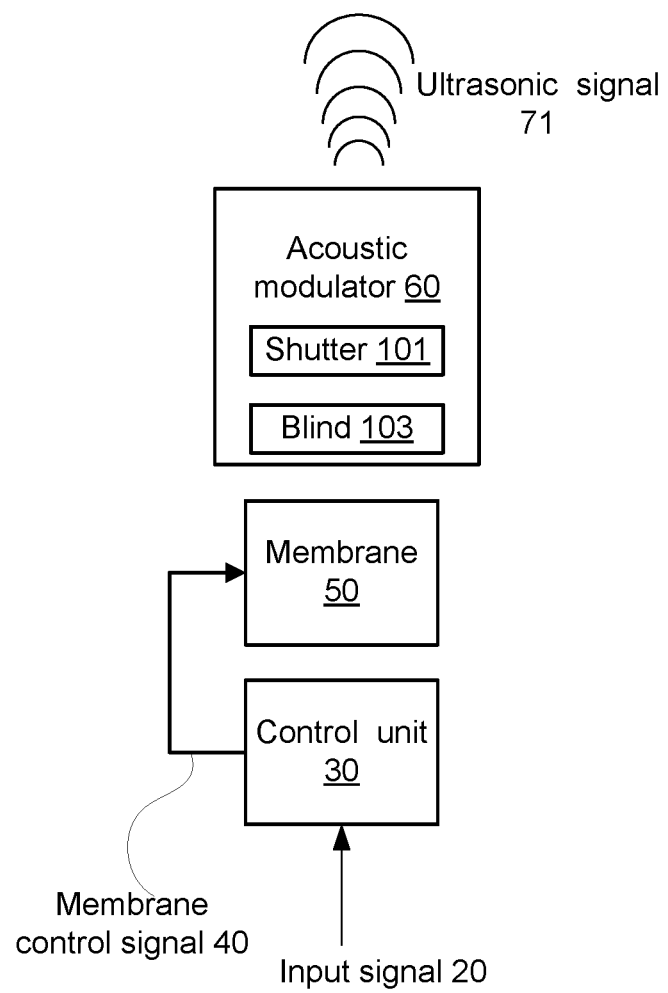
FIG. 1B illustrates a MEMS speaker according to an embodiment of the invention.

FIG. 1B illustrates MEMS speaker 10 that operates in an ultrasonic output mode and outputs ultrasonic output signal 71. Control unit 30 sends a membrane control signal 40 to membrane 50. Membrane 50 oscillates and outputs the ultrasonic output signal 71. Shutter 101 and blind 103 may not be oscillated by control unit 30 during the ultrasonic output mode.

Figure 1C:
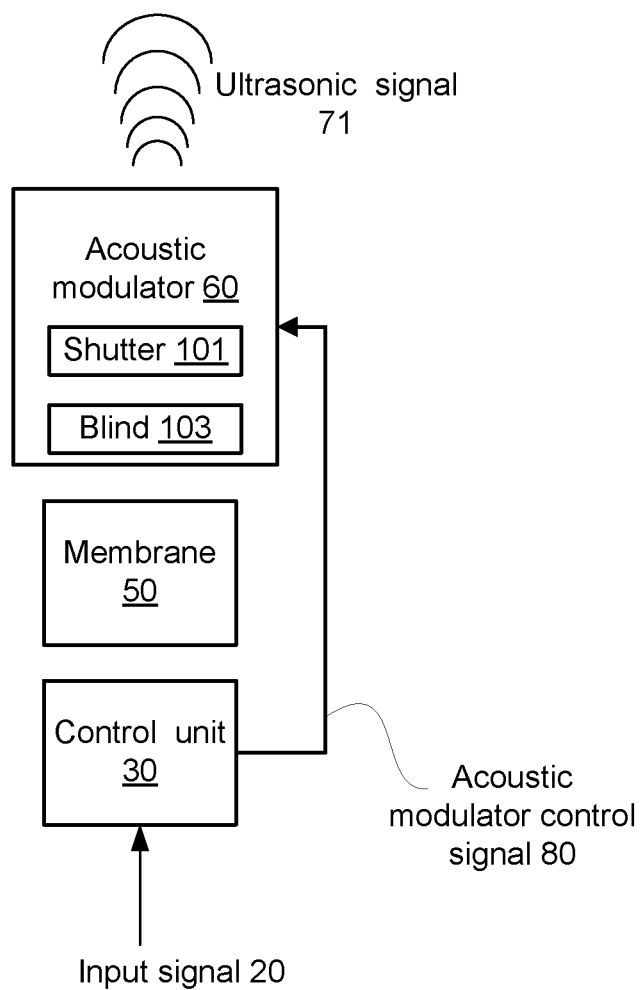
FIG. 1C illustrates a MEMS speaker according to an embodiment of the invention.

FIG. 1C illustrates MEMS speaker 10 that operates in an ultrasonic output mode and outputs ultrasonic output signal 71. Control unit 30 sends an acoustic modulator control signal 80 to acoustic modulator 60. Blind 103 and/or shutter oscillate and outputs the ultrasonic output signal 71. Membrane 50 may not be oscillated by control unit 30 during the ultrasonic output mode.

Figure 1D:
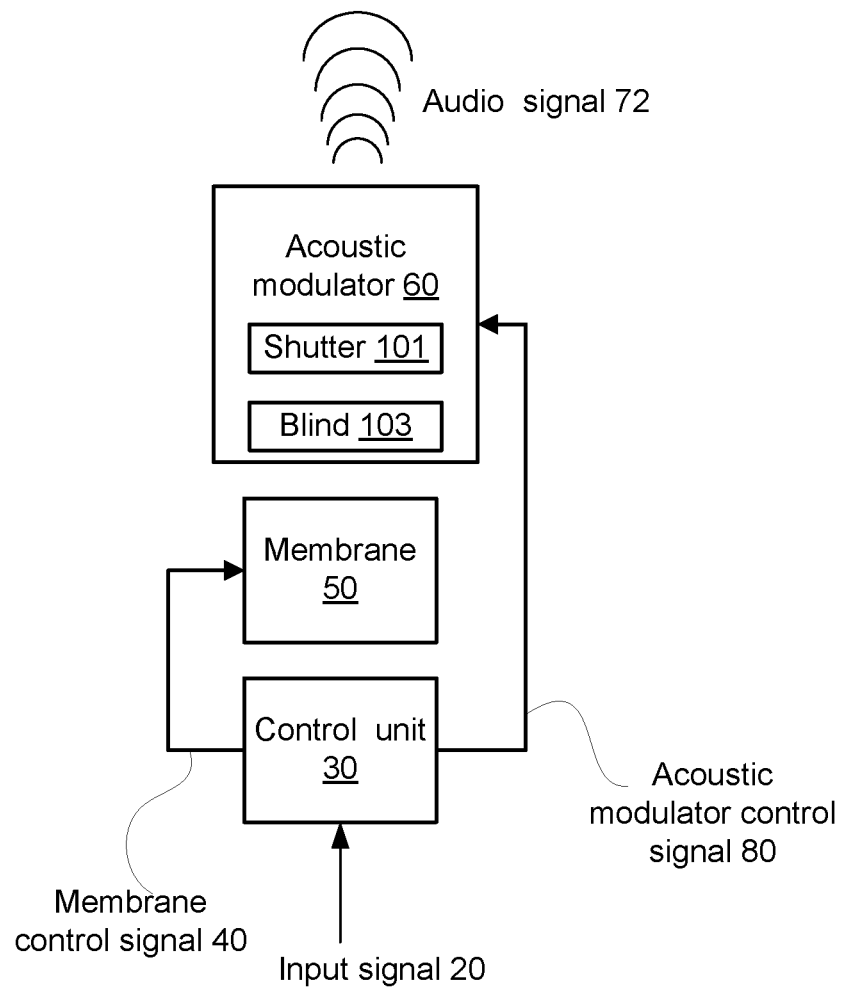
FIG. 1D illustrates a MEMS speaker according to an embodiment of the invention.

FIG. 1D illustrates MEMS speaker 10 that operates in an audio output mode and outputs audio output signal 72.

MEMS speaker 10 oscillates the membrane 50 (by membrane control signal 40) thereby generating an ultrasonic signal and oscillates at least one of the shutter 101 and the blind 103 (by acoustic modulator control signal 80) thereby modulating the ultrasonic acoustic signal to generate audio output signal 72.

Figure 1E:
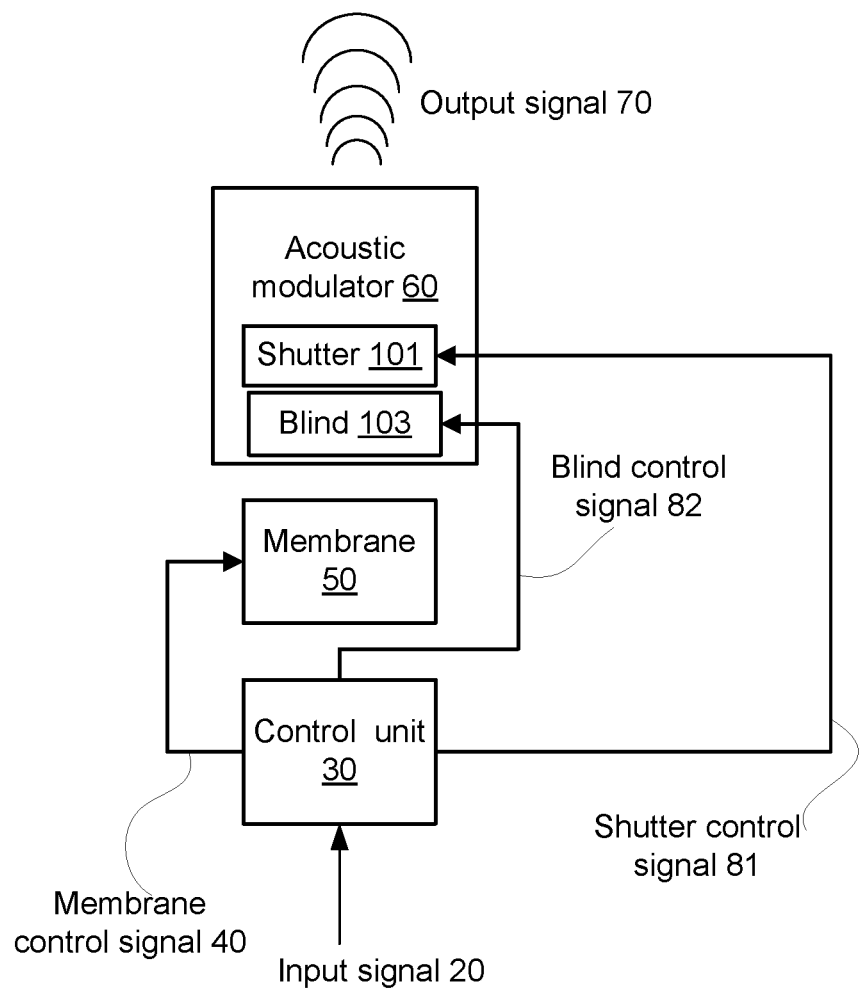
FIG. 1E illustrates a MEMS speaker according to an embodiment of the invention.

FIG. 1E illustrates MEMS speaker 10. The acoustic modulator control signal 80 may include blind control signal 82 for controlling blind 103 and shutter control signal 81 for controlling shutter 101.

Blind control signal 82 and shutter control signal 81 may be generated independently by control unit 30.

FIGS. 1F-1J illustrate a MEMS speaker 10 that includes a detector 90, in addition to control unit 30 and multiple MEMS elements (shutter 101, blind 103 and membrane 50).

Detector 90 is mechanically coupled to at least one MEMS elements out of membrane 50, shutter 101 and blind 103, and may sense the vibrations of the at least one MESE element. The vibrations are responsive to a reception of an ultrasonic input signal 73 by the MEMS speaker 10.

Figure 1F:
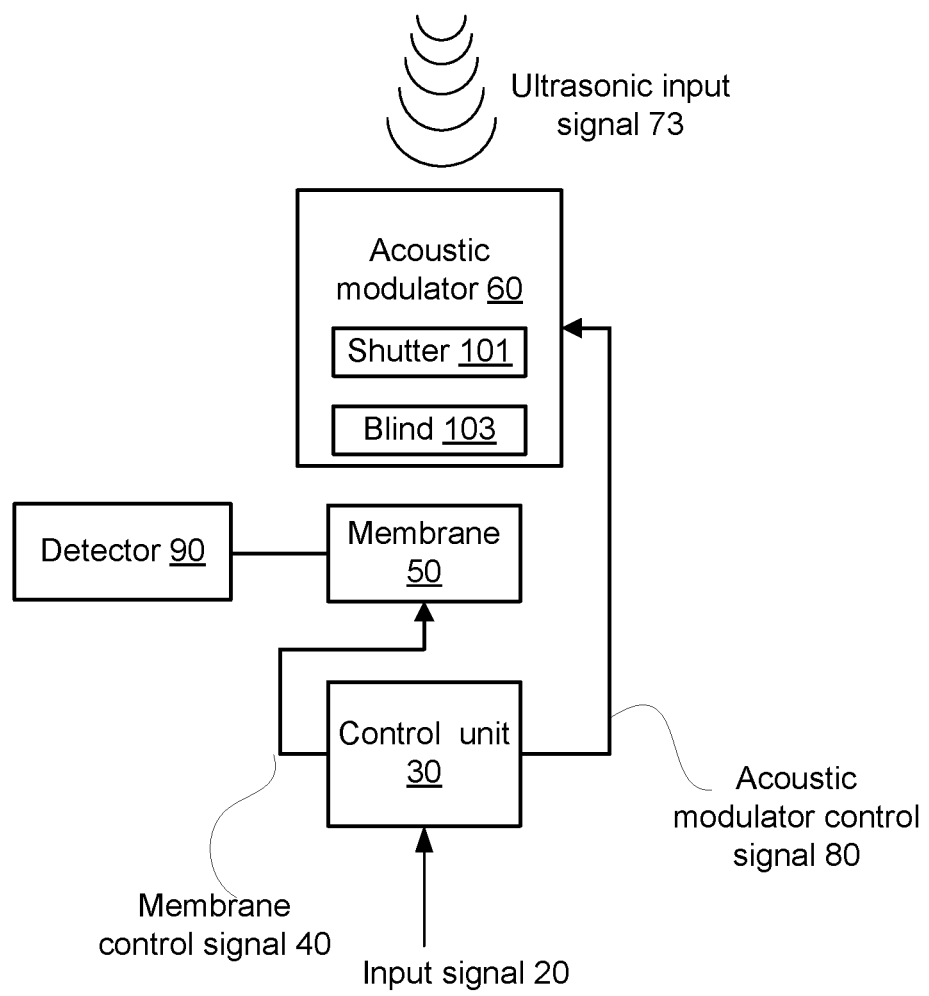
FIG. 1F illustrates a MEMS speaker according to an embodiment of the invention.

In FIG. 1F the detector 90 is mechanically coupled to membrane 50 and is configured to sense vibrations of membrane 50.

Figure 1G:
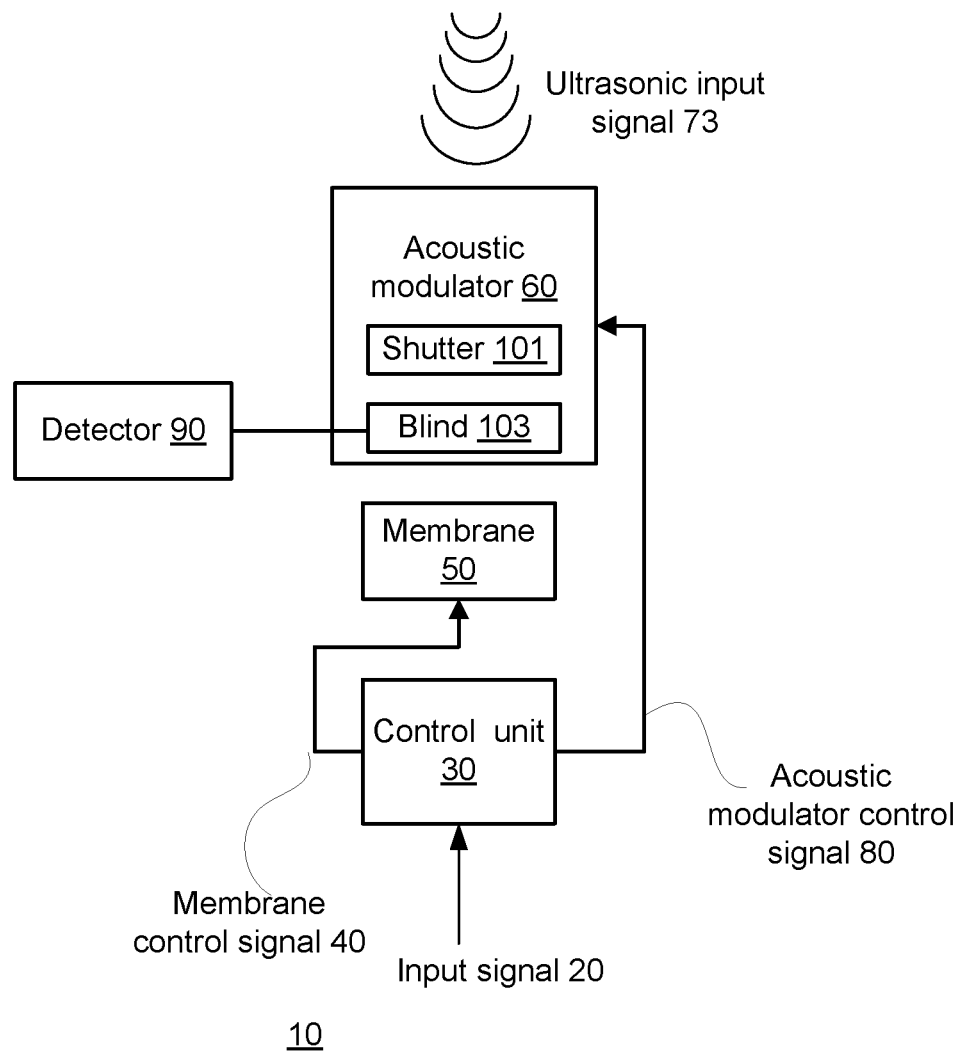
FIG. 1G illustrates a MEMS speaker according to an embodiment of the invention.

In FIG. 1G the detector 90 is mechanically coupled to blind 103 and is configured to sense vibrations of blind 103.

Figure 1H:
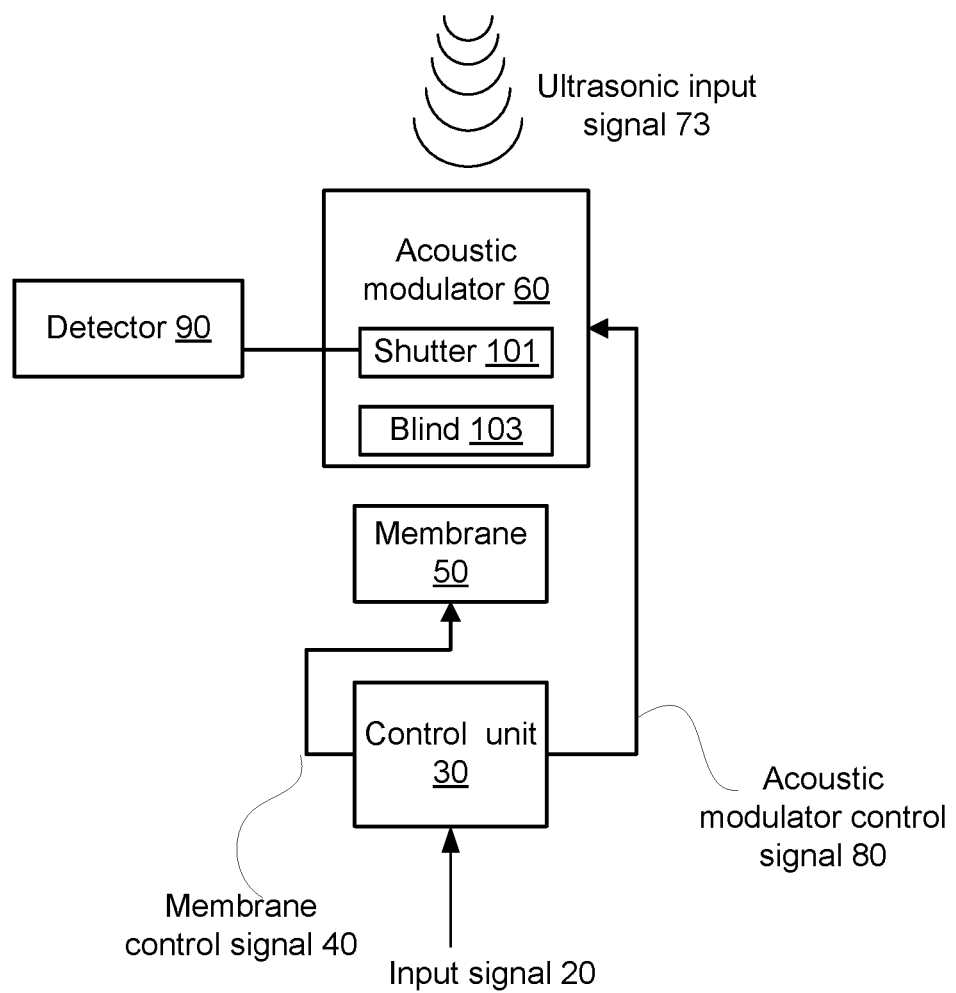
FIG. 1H illustrates a MEMS speaker according to an embodiment of the invention.
Figure 1I:
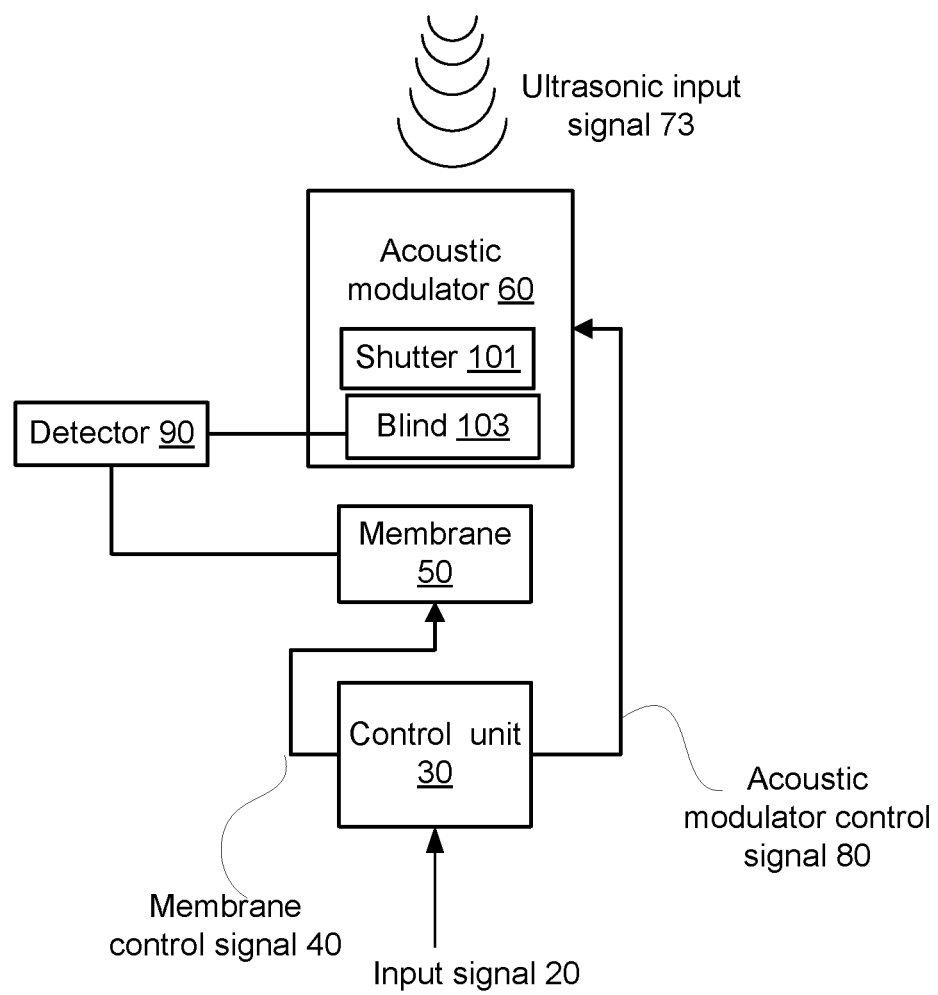
FIG. 1I illustrates a MEMS speaker according to an embodiment of the invention.

In FIG. 1H the detector 90 is mechanically coupled to shutter 101 and is configured to sense vibrations of shutter 101.

In FIG. 1G the detector 90 is mechanically coupled to membrane 50 and to blind 103, and is configured to sense vibrations of each one of membrane 50 and blind 103.

Figure 1J:
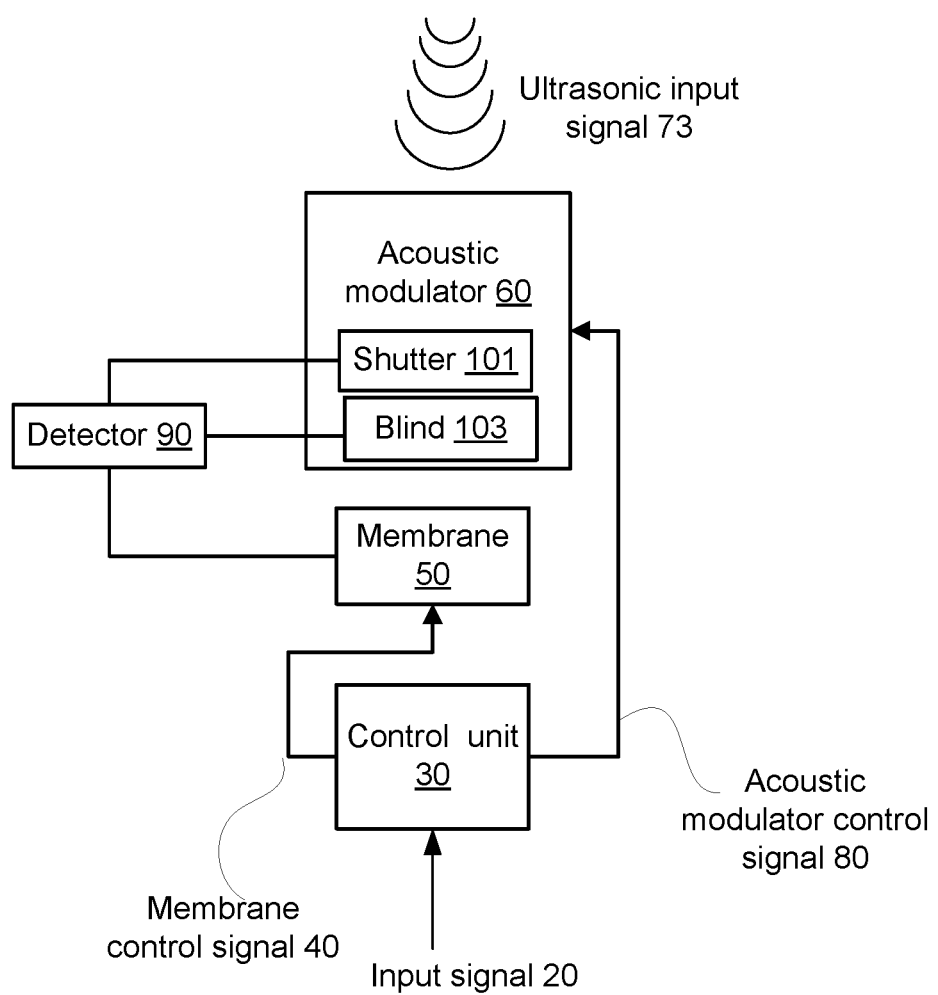
FIG. 1J illustrates a MEMS speaker according to an embodiment of the invention.

In FIG. 1J the detector 90 is mechanically coupled to membrane 50, to shutter 101 and to blind 103, and is configured to sense vibrations of each one of membrane 50, shutter 101 and blind 103.

It should be noted that the using a detector (denoted 90 in FIG. 1J) for detecting vibrations of at least one of the membrane, shutter or blind (vibrations resulting from ultrasound input signal 73—and not from vibration induced by the control unit) can be applied in an MEMS speaker that operate only in an ultrasonic output mode or in an MEMS speaker that operate only in an audio output mode.

Figure 2:
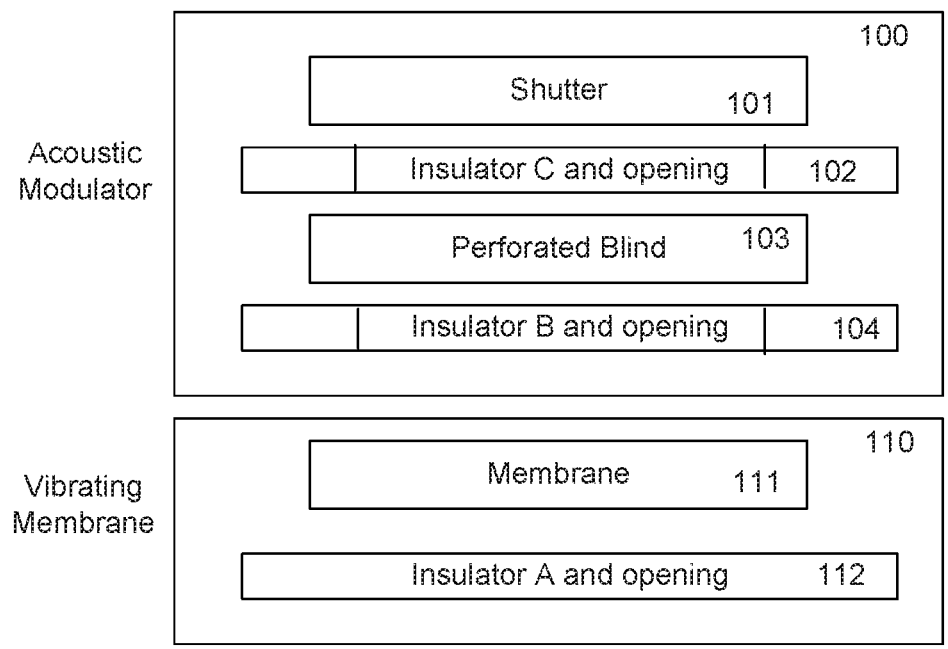
FIG. 2 is diagram of the mechanical construction of a pico-speaker as described in FIG. 1 according to an embodiment of the invention.

FIG. 2 is diagram of the mechanical construction of a MEMS speaker as described in FIG. 1. The vibrating membrane 110 consists of two parts, the membrane 111 and an insulator and support structure 112, which mechanically supports the membrane and also allows the membrane to vibrate. The acoustic modulator 100 consists of four parts. Structural support 104 separates and supports the perforated blind 103. The blind 103 is a rigid but receives a separate control signal than the shutter sheet that has apertures in it to allow the flow of air resulting from the vibrating membrane. Support structure 104 separates the blind 103 from the membrane 111 so as to supports the blind 103 but also to allows room for the membrane 111 to vibrate. Support structure 102 separates the blind 103 and the shutter 101 such that the shutter 101 is supported but can still vibrate. The action is that as the shutter 101 vibrates it may selectively narrow and widen the path of air that may flow through the acoustic modulator and thus may selectively interrupt the air flow from membrane 111.

The membrane, blind, shutter and any supporting elements that support either one of the membrane, blind and shutter may be manufactured by (or have a configuration) illustrated in each one of the following patent applications, all being incorporated herein by reference:
 a. U.S. patent application Ser. No. 15/072,379 filing date Mar. 17, 2016.
 b. U.S. patent application Ser. No. 15/071,230 filing date Mar. 16, 2016.
 c. U.S. patent application Ser. No. 15/075,246 filing date Mar. 21, 2016.

FIGS. 3A-3E are examples of MEMS speaker mechanical design 250 together with example designs for the membrane 200, blind 210 and shutter 220 that are fed by a membrane control signal 530, blind control signal 570 and shutter control signal 580 respectively according to various embodiments of the invention. In this example the speaker element mechanical design is a small cylinder. The mechanical assembly is shown as a part cut away diagram for clarity. The speaker design consists of the membrane, blind and shutter as well as the three support structures as introduced in FIG. 2. The interface and control block, 30 as described in FIG. 1, is generally external to the mechanical speaker package.

Figure 3A:
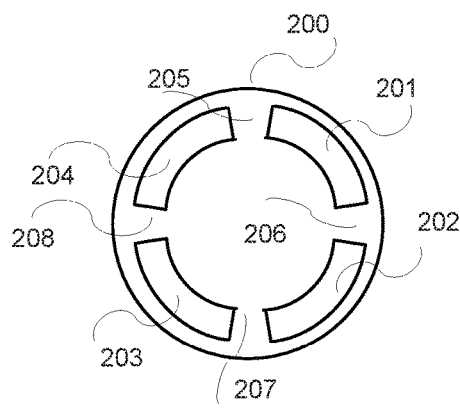
FIG. 3A is an example of the design of membrane according to an embodiment of the invention.
Figure 3B:
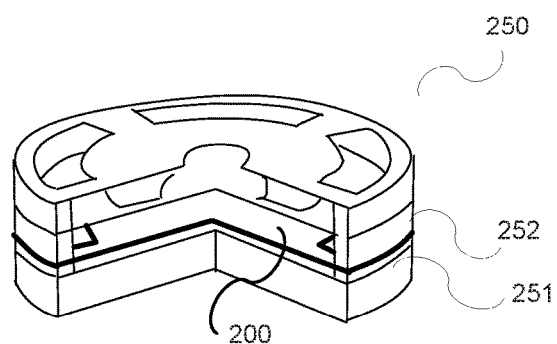
FIG. 3B is a sketch of the mechanical assembly of an example pico-speaker showing the membrane according to an embodiment of the invention.

FIG. 3A is an example of the design of membrane 200. The membrane 200 is a circular design with four symmetrical apertures 201, 202, 203 and 204 situated at the edge of the membrane, suspended on springs 205, 206, 207 and 208. The four springs with the corresponding apertures facilitate the vibration of the membrane. FIG. 3B is a sketch of the mechanical assembly of an example speaker showing the structural support, 251 and above that the membrane 200. Above the membrane 200 is structural support 253. The membrane 200 is therefore sandwiched between the two structural supports 251 and 253. Structural support 251 will typically consist of a base and an outer edge support for the membrane 200. Insulator 252 will typically be a ring that supports the out edge of the membrane 200 thus allowing the membrane to vibrate freely.

Figure 3C:
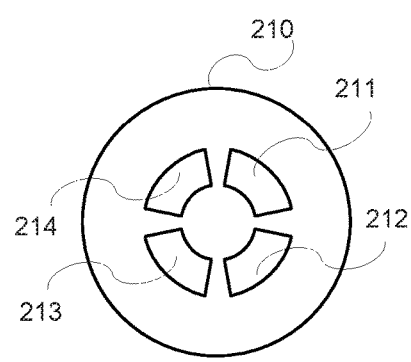
FIG. 3C is an example of the design of a blind according to an embodiment of the invention.
Figure 3D:
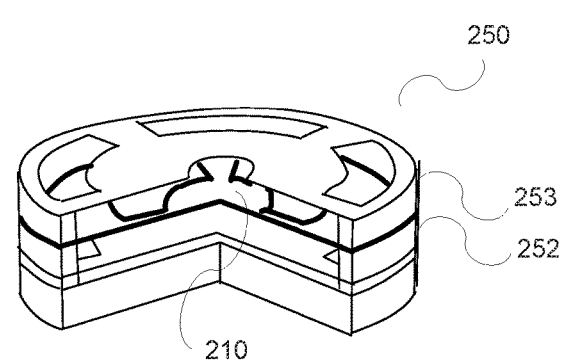
FIG. 3D is a sketch of the mechanical assembly of an example pico-speaker showing the blind according to an embodiment of the invention.

FIG. 3C is an example of the design of a blind 210. The blind 210 is a circular design with four symmetrical apertures 211, 212, 213 and 214. The four apertures are located such that the air flow from the membrane vibrations can freely pass through the apertures. FIG. 3D is again the sketch of the mechanical assembly 250 of an example speaker. The blind 210 is sandwiched between the two insulators 252 and 253 respectively. Structural supports 252 and 253 will typically be of a ring design holding the blind firmly in place but allowing air to flow through the center.

Figure 3E:
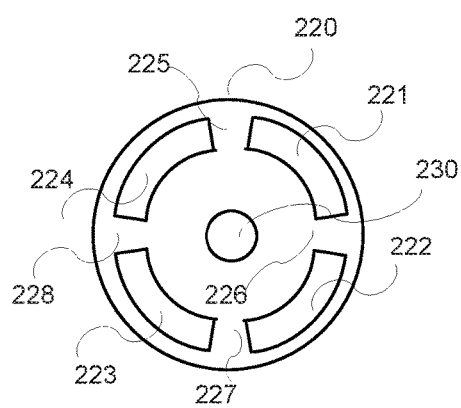
FIG. 3E is an example of the design of a shutter according to an embodiment of the invention.
Figure 3F:
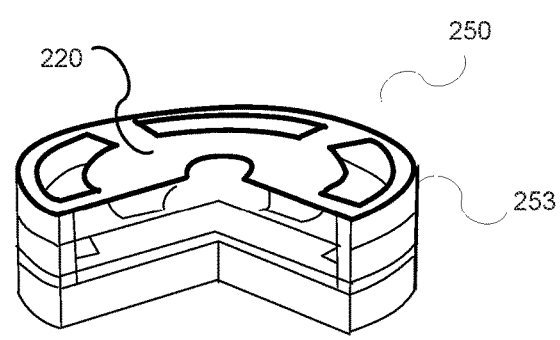
FIG. 3F is a sketch of the mechanical assembly of an example pico-speaker showing the shutter according to an embodiment of the invention.

FIG. 3E is an example of the design of a shutter 220. The shutter 220 is a circular design with four symmetrical apertures 221, 222, 223 and 224 and four corresponding springs 225, 226, 227 and 228, which are at the outer edge and have the purpose of facilitating the vibration of the shutter. There is also a circular aperture 230 at the center of the shutter 220. It can be readily seen that if the shutter 220 is placed on top of the blind 210, then the apertures 211, 212, 213, and 214 of the blind 210 will be shut off. FIG. 3F is again the sketch of the mechanical assembly 250 of an example speaker element. The shutter 220 is supported by support structure 253.

Figure 4A:
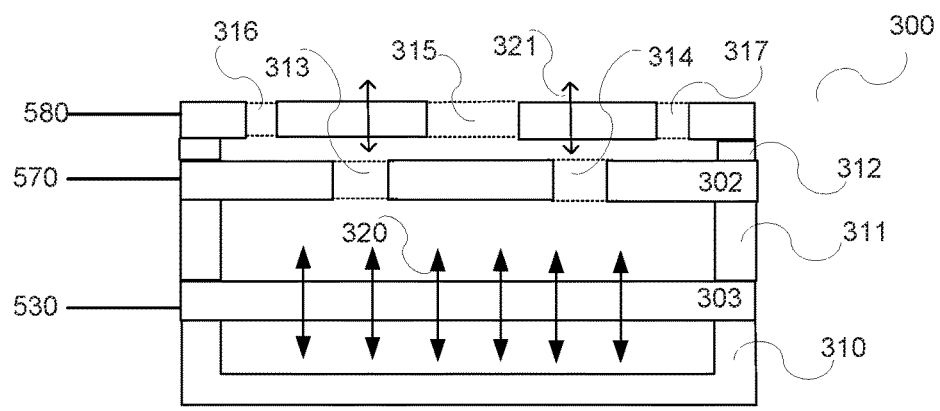
FIG. 4A represents the condition when the shutter is in its neutral position according to an embodiment of the invention.
Figure 4B:
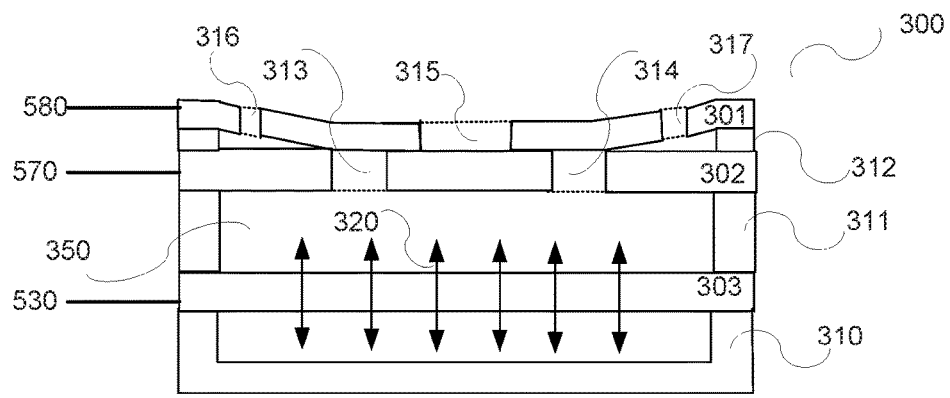
FIG. 4B depicts the state when the shutter is caused to be depressed towards the blind according to an embodiment of the invention.
Figure 4C:
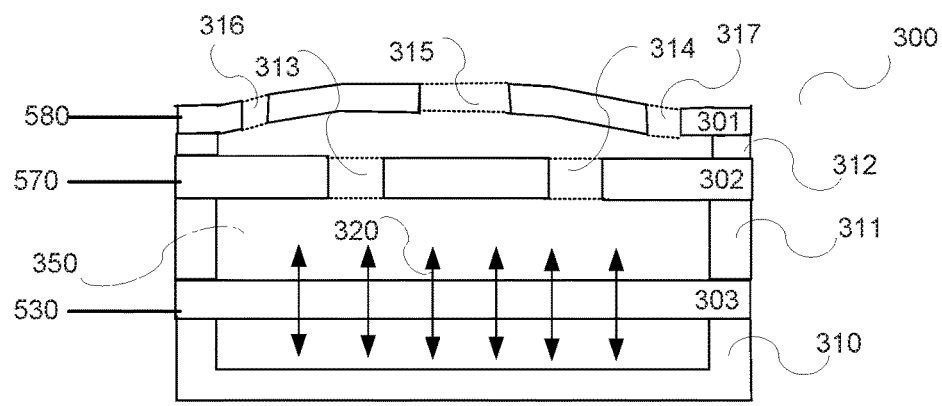
FIG. 4C depicts the state when the shutter is caused to be moved away from the blind according to an embodiment of the invention.

FIGS. 4A-4C are cross sections 300 of the mechanical design of the MEMS speaker that includes a membrane, shutter and blind that are fed by a membrane control signal 530, blind control signal 570 and shutter control signal 580 respectively according to various embodiments of the invention. FIG. 4A represents the condition when the shutter 301 is in its neutral position. The membrane 303 is supported by support structure 310. The membrane is caused to vibrate 320 in the plane perpendicular to its mounting. The blind 302 is supported by structure 311 and the shutter 301 is supported by support structure 312. Note that the apertures 313, 314 in the blind 302 and the apertures 315, 316 and 317 in the shutter 301 are such that they are not aligned with each other. FIG. 4B depicts the state when the shutter 301 is caused to be depressed towards the blind 302. The apertures 313 and 314 in the blind 302 are closed off by the shutter 301. FIG. 4C depicts the state when the shutter 301 is caused to be moved away from the blind 302. The apertures 313 and 314 in the blind 302 are now open and the acoustic wave produced by the vibrating membrane 303 can escape via the apertures 313 and 314 in the blind 302 and the apertures 315, 316 and 317 in the shutter 301.

Note that the apertures 313 and 314 shown in the blind 302 are representative of the four apertures 211, 212, 213, 214 in the blind 210 as shown in FIG. 3C. Similarly, the apertures 316 and 317 shown in the shutter 301 are representative of the four apertures 221, 222, 223 and 224 in the shutter 220 as shown in FIG. 3E.

The acoustic modulator formed by the rigid perforated blind and the shutter cause the ultrasonic vibrations of the membrane to be converted to air waves that are at the required audio signal frequencies. As will be appreciated by one of skill in the art that the actual geometry of the apertures in the membrane, blind and shutter as shown in the figures can be varied and that the figures are for informative purposes only and are not to scale or intended to represent any particular practical design. The advantages of the design concepts as described herein are well documented. It will be pointed out, however, that the basic principle is that by vibrating the membrane at ultrasonic frequencies the resulting sound pressure is much higher than could be established by a membrane vibrating at audio frequencies. Note when the shutter closes the apertures in the blind, the sound pressure level (SPL) of the wave generated by the membrane decreases, and when the shutter opens the apertures in the blind, the SPL of the same wave is increased. The action of the shutter and blind in modulating the ultrasonic wave results in the audio-frequency generation that has a flat sound pressure level (SPL) response across a wide audio frequency band.

Figure 5A:
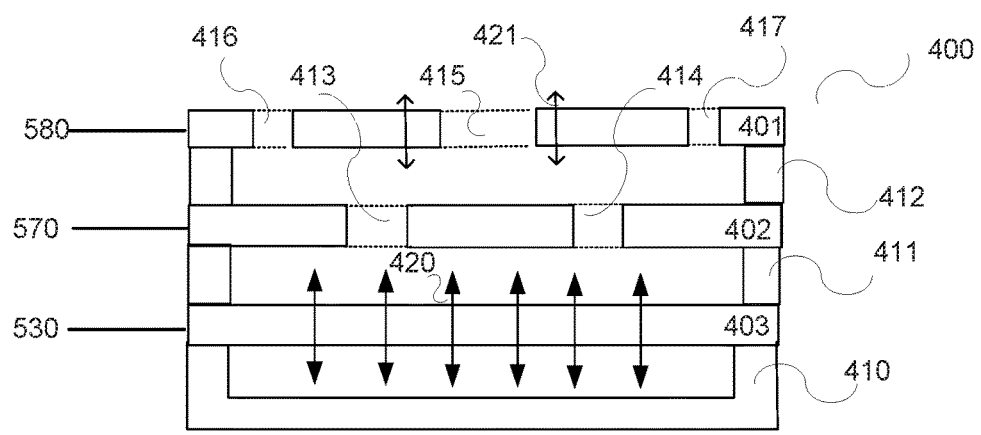
FIG. 5A represents the condition when the shutter and the blind are in their neutral position according to an embodiment of the invention.
Figure 5B:
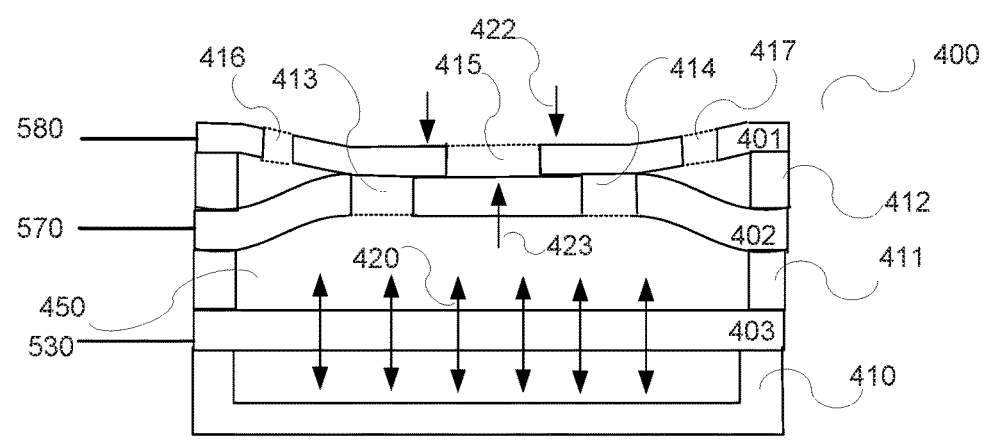
FIG. 5B depicts the state when the shutter and the blind are caused to be depressed towards each other according to an embodiment of the invention.
Figure 5C:
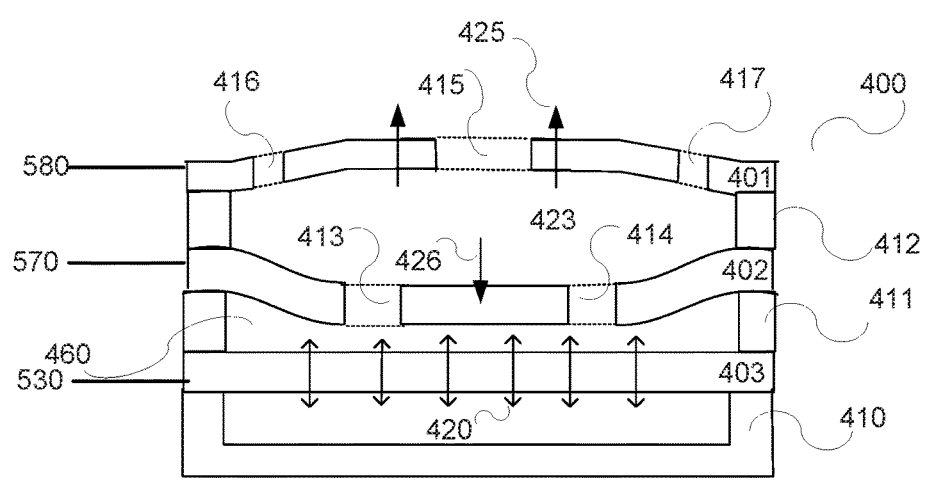
FIG. 5C depicts the state when the shutter and the blind are caused to be moved away from each other according to an embodiment of the invention.

FIGS. 5A-5C are cross sections 400 of the mechanical design of the MEMS speaker according to the embodiment of the invention. FIG. 5A represents the condition when the shutter 401 is in its neutral position. The membrane 403 is supported by support structure 410. As before, the membrane 403 is caused to vibrate 420 in the plane perpendicular to its mounting. The blind 402 is supported by support structure 411 and the shutter 401 is supported by support structure 412. Note again that the apertures 413, 414 in the blind 402 and the apertures 415, 416 and 417 in the shutter 401 are such that they are not aligned with each other. FIG. 5B depicts the state when the shutter 401 is caused to be depressed towards the blind 402. Note, however, that in this disclosure the blind 402 is also flexible and in this condition it is caused to move upwards towards the shutter 401. The apertures 413 and 414 in the blind 402 are closed off by the shutter 401. FIG. 5C depicts the state when the shutter 401 is caused to be moved away from the blind 402. As the blind is now flexible in this condition, it is caused to move away from the shutter 401. The apertures 413 and 414 in the blind 402 are now open and the wave produced by the vibrating membrane 403 can escape via the apertures 413 and 414 in the blind 402 and the apertures 415, 416 and 417 in the shutter 401.

The depth of the modulation of the shutter determines the efficiency of transformation of energy from the ultrasonic wave generated by the membrane to the desired audio frequency wave. The bigger the modulation depth, the more energy will be transferred to audio. This depth of modulation is effectively the difference in attenuation of the ultrasonic wave by the shutter when it is open, as shown in FIG. 4C and FIG. 5C, and when it is closed as shown in FIG. 4B and FIG. 5B. The attenuation is determined by the distance between the blind 402 and the shutter 401. For a given geometry of the shutter, the smaller the distance between the shutter and the blind, the bigger is the attenuation. Thus, the bigger the distance change between the blind and the shutter during the operation of the shutter, the bigger the modulation, and the more efficient is the transfer of energy from ultrasound to audio. The distance between the plates 401 and 402 is determined by the deformation of the plates. In the case of a rigid static blind 302 as shown in FIG. 4, only the shutter 301 is deformed and closing the distance between the plates. In the case where the blind 402 is flexible, as shown in FIGS. 5A-5C, both the blind 402 and the shutter 401 are deformed. Thus, to achieve the same modulation or to produce the same distance between the plates as was produced by the rigid blind, in case of a flexible blind 402, a smaller force is required to be applied to each plate, the blind 401, and the shutter 402. Hence, the result is a significant reduction, in the order of 30% to 40%, in the value of the stimulus signal that needs to be supplied to the speaker modulator. Although the vibration of the shutter and blind are shown as a flexing of the material, the shape of the flexing is shown for example purposes only. The same action could be achieved by a movement up and down of the blind and shutter by vibrating the spacers between them.

There may be different embodiments to implement this scheme of an acoustic modulator using flexible shutter and blind plates. In one embodiment electrostatic actuation may be used. A potential difference at ultrasonic frequency is applied to the flexible blind 401 and flexible shutter 402. This causes an electrostatic attraction force to operate between the plates, with the result that the two plates will move closer together. An electrical potential difference at ultrasonic frequency may be applied to the rigid blind 301 and flexible shutter 302 but in this case the closing of the distance between the two plates is a result of only the shutter 302 flexing whereas in case where the blind is also flexible, the distance between the two plates is the result of both the blind and the shutter flexing, enabling higher modulation with a lower applied force, and thus smaller actuation voltage.

In another embodiment a piezoelectric actuation scheme may be used. A separate actuation voltage may be applied to each of the two plates, blind and shutter. Similarly to the previous embodiment, the actual actuation voltage required from the combination of a flexible shutter and a flexible blind is reduced relative to the combination of a rigid blind and flexible shutter in order to achieve the same modulation.

Figure 6:
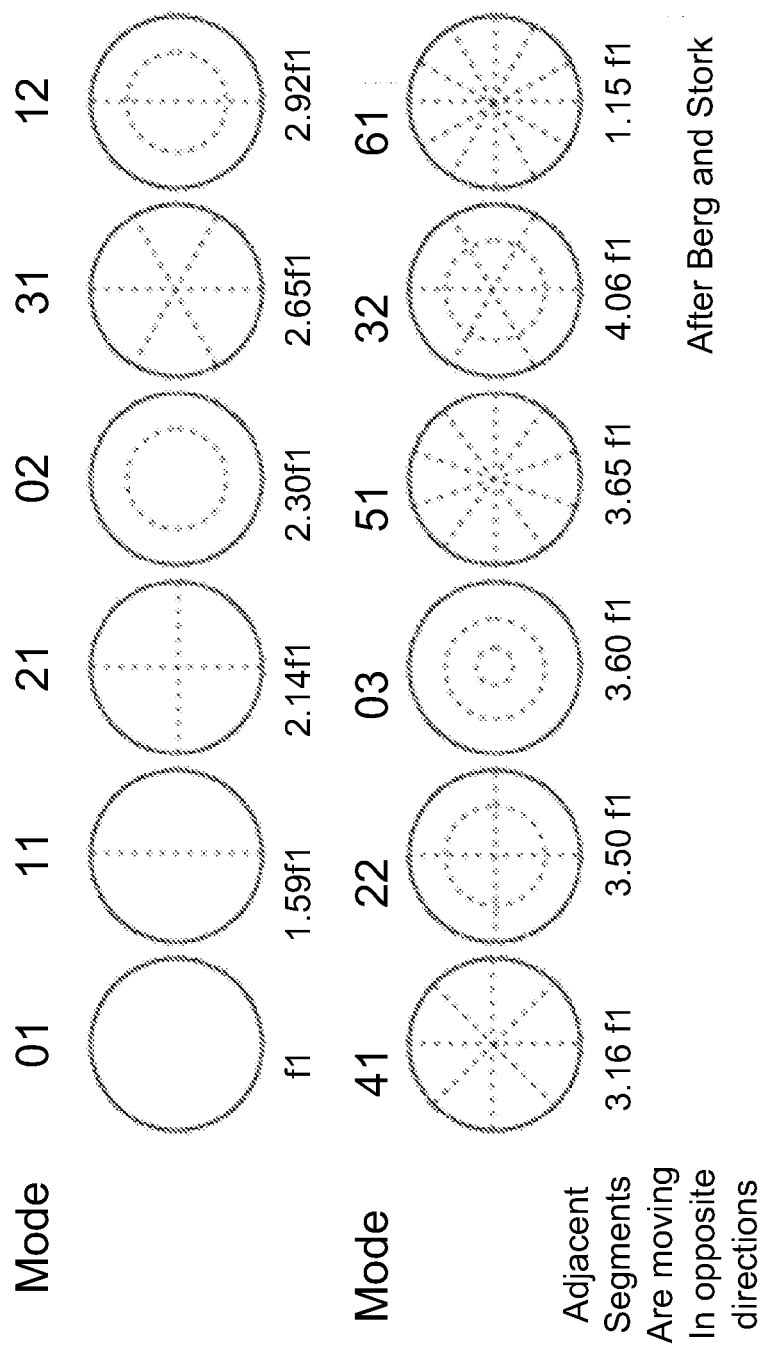
FIG. 6 illustrates a MEMS speaker and especially the different modes of operation of the MEMS speaker according to an embodiment of the invention.

FIG. 6 shows an alternative implementation of a dual-mode Audio-Ultrasonic speaker, which is based on a single wide-band membrane which has good response both in Audio and Ultrasonic range. There different modes of the circular membrane are depicted, with their relative frequencies.

To generate ultrasonic signals, higher-order modes of the same membrane are used. Thus, if F1=6 KHz (Audio range) in the mode 01, the membrane can still achieve low ultrasound response at F=4.06*F1=f24 KHz at mode 32.

For example, if we chose the basic frequency of the membrane to be f1=6 KHz, it can also generate vibrations in the ~4f1=~24 KHz, i.e. low US. It should be noted however that this embodiment has the limitation of relatively low-frequency US, up to low tenths of KHz, as well as much lower efficiency and power for Ultrasonic signal generated, due to the fact that the Ultrasonic is coming from "high" modes of vibration of the membrane.

There is provided a generation of dual and concurrent audio and Ultrasonic signals for dual-mode operation on a MEMS speaker. It is applicable for use in mobile devices such as smartphones, iPads, smart watches, wearable devices, laptops etc. The invention claimed in this patent can be used to support high-quality audio generation as required by today's mobile and wearable devices, as well as Ultrasonic-enabled applications such as: stylus-based inputs either on-screen or on a nearby desktop, touch-less interfaces such as gestures to perform commands, etc. Using a MEMS speaker that generates dual and concurrent audio and Ultrasonic signals, this invention can potentially reduce space constraints, reduce costs, and improve power efficiency.

Figure 7:
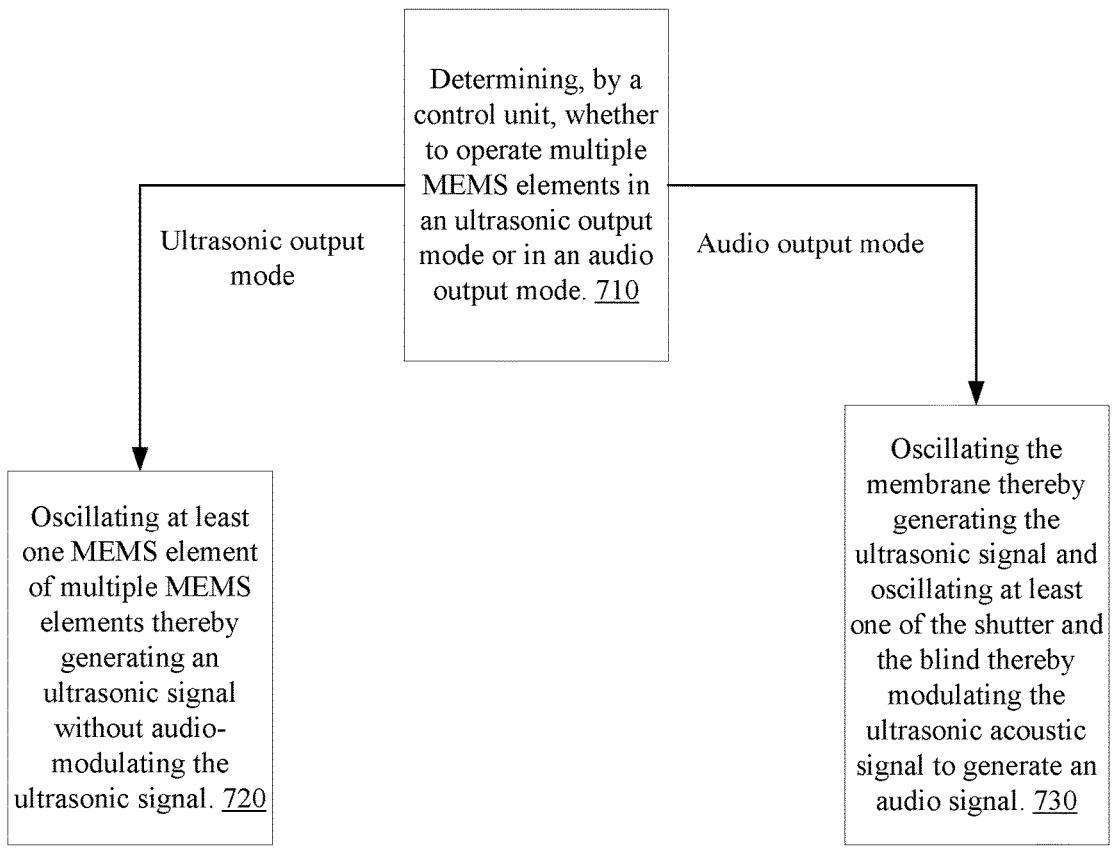
FIG. 7 illustrates a method according to an embodiment of the invention.

FIG. 7 illustrates method 700 according to an embodiment of the invention.

Method 700 may start by step 710 of determining, by a control unit, whether to operate multiple MEMS elements in an ultrasonic output mode or in an audio output mode.

When determining to operate multiple MEMS elements in an ultrasonic output mode then step 710 is followed by step 720 of oscillating at least one MEMS element of multiple MEMS elements thereby generating an ultrasonic signal without audio-modulating the ultrasonic signal. The multiple MEMS elements include a membrane that is positioned in a first plane, a blind that is positioned in a second plane and a shutter that is positioned in a third plane.

When determining to operate multiple MEMS elements in an audio output mode then step 710 is followed by step 730 of oscillating the membrane thereby generating the ultrasonic signal and oscillating at least one of the shutter and the blind thereby modulating the ultrasonic acoustic signal to generate an audio signal.

Figure 8:
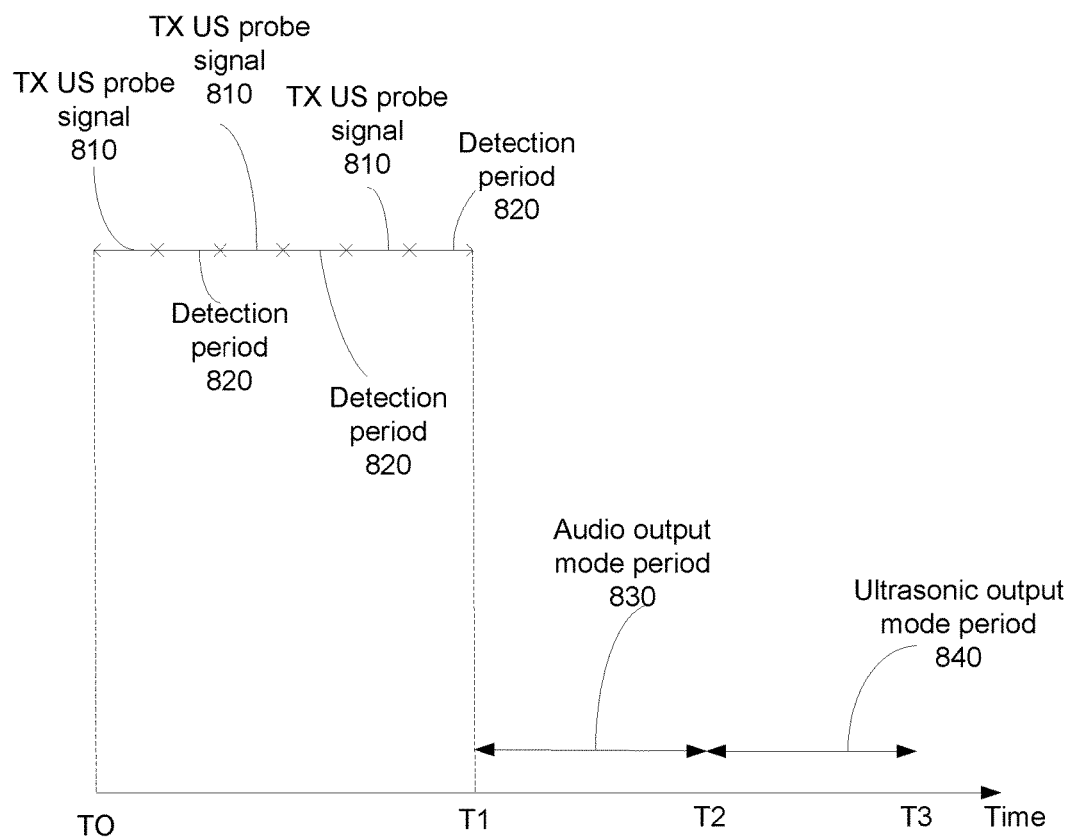
FIG. 8 is a timing diagram according to an embodiment of the invention.

FIG. 8 is a timing diagram that illustrates different periods during which the MEMS speaker 10 operates at different modes of operation. The duration of these periods may span between a fraction of a second to few seconds, few minutes and even more.

During a first period (between T0 and T1) the MEMS speaker performs multiple repetitions (three in this example) of a transmission of an ultrasound probe signal (TX US probe signal 810) and a detection of an echo during detection period 820. The number of repetitions may be one two, three, or exceed three.

During a second period (between T1 and T2)—denoted "audio output mode period 830"—the MEMS speaker operates in the audio output mode.

During a third period (between T2 and T3)—denoted "ultrasonic output mode period 830"—the MEMS speaker operates in the ultrasonic output mode.

Any of the figures may or may not be in scale.

Although some figures (FIGS. 1A-1J, 2, 3A-3F, 4A-4C and 5A-5C) illustrate a MEMS speaker that includes a single membrane, a single shutter and a single blind it should be noted that there may be provided multiple MEMS speakers that include multiple shutters, multiple blinds and multiple membranes.

The multiple MEMS speakers may be controlled by one or more control units and may or may not be coupled to one or more detectors. The multiple MEMS speakers may be arranged in an array or may be arranged in any other manner. The multiple membranes may or may not be arranged in a same first plane. The multiple blinds may or may not be arranged in a same second plane. The multiple shutters may or may not be arranged in a same third plane.

Alternatively—there may be provided a MEMS speaker that includes multiple MEMS speaker elements—each MEMS speaker element may include a membrane, a shutter and a blind. The multiple MEMS speaker elements may include multiple shutters, multiple blinds and multiple membranes. The multiple MEMS speaker elements may be controlled by one or more control units and may or may not be coupled to one or more detectors. The multiple MEMS speaker elements may be arranged in an array or may be arranged in any other manner. The multiple membranes may or may not be arranged in a same first plane. The multiple blinds may or may not be arranged in a same second plane. The multiple shutters may or may not be arranged in a same third plane.

Any reference to any of the terms "comprise", "comprises", "comprising" "including", "may include" and "includes" may be applied to any of the terms "consists", "consisting", "and consisting essentially of". For example— any of figures describing masks used for implementing the MEMS device may include more components that those illustrated in the figure, only the components illustrated in the figure or substantially only the components illustrate in the figure.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between MEMS elements are merely illustrative and that alternative embodiments may merge MEMS elements or impose an alternate decomposition of functionality upon various MEMS elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single MEMS device. Alternatively, the examples may be implemented as any number of separate MEMS devices or separate MEMS devices interconnected with each other in a suitable manner. However, other modifications, variations and alternatives are also possible. The specifications and

We claim:

1. A micro-electro-mechanical system (MEMS) speaker that comprises:
   multiple MEMS elements that comprise a membrane positioned in a first plane, a blind that is positioned in a second plane and a shutter that is positioned in a third plane;
   a control unit that is configured to control the multiple MEMS elements to operate in an audio output mode or an ultrasonic output mode; and
   a detector that is coupled to at least one MEMS element of the multiple MEMS elements;
   wherein the MEMS speaker is configured, when operating in the ultrasonic output mode, to oscillate at least one of the membrane, blind and shutter thereby generating an ultrasonic signal without audio-modulating the ultrasonic signal;
   wherein the MEMS speaker is configured, when operating in the audio output mode, to oscillate the membrane thereby generating the ultrasonic signal and oscillate at least one of the shutter and the blind thereby modulating the ultrasonic acoustic signal to generate an audio signal; and
   wherein the detector is configured to sense ultrasonic vibrations of the at least one MEMS element, during a detection period during which the MEMS speaker is not induced to vibrate by the control unit.

2. The MEMS speaker according to claim 1, wherein the at least one MEMS element is a single MEMS element.

3. The MEMS speaker according to claim 2 wherein the MEMS element is configured to vibrate as a result of a reception of an ultrasonic echo; wherein the MEMS speaker is configured to output an ultrasonic probe signal during a transmission period that preceded the detection period; and wherein the ultrasonic echo results from the transmission of ultrasonic probe signal.

4. The MEMS speaker according to claim 1, wherein the at least one MEMS element is the multiple MEMS elements; wherein the detector is configured to sense ultrasonic vibrations of each one of the multiple MEMS elements, during the detection period during which the MEMS speaker is not induced to vibrate by the control unit.

5. The MEMS speaker according to claim 1 wherein the MEMS speaker is configured, when operating in the audio output mode, to send a shutter control signal for oscillating the shutter and send a blind control signal for oscillating the blind.

6. The MEMS speaker according to claim 1 wherein the control unit is configured, when operating in the audio output mode, to receive an input signal that represents the audio signal, and to control one or more of the multiple MEMS elements based on the input signal.

7. A method for generating an output signal by a micro-electro-mechanical system (MEMS) speaker, the method comprises:
   oscillating, when operating in an ultrasonic output mode, at least one MEMS element of multiple MEMS elements thereby generating an ultrasonic signal without audio-modulating the ultrasonic signal; wherein the multiple MEMS elements comprise a membrane that is positioned in a first plane, a blind that is positioned in a second plane and a shutter that is positioned in a third plane;
   oscillating, wherein operating in the audio output mode, the membrane thereby generating the ultrasonic signal and oscillating at least one of the shutter and the blind thereby modulating the ultrasonic acoustic signal to generate an audio signal; and
   sensing, by a detector that is coupled to at least one MEMS element of the multiple MEMS elements, ultrasonic vibrations of the at least one MEMS element, during a detection period during which the MEMS speaker is not induced to vibrate by the control unit.

8. The method according to claim 7 wherein the at least one MEMS element is a single MEMS element.

9. The method according to claim 8 wherein the MEMS element vibrates as a result of a reception of an ultrasonic echo; wherein the method comprises outputting, by the MEMS speaker, an ultrasonic probe signal during a transmission period that preceded the detection period; and wherein the ultrasonic echo results from the transmission of ultrasonic probe signal.

10. The method according to claim 7 wherein the at least one MEMS element is the multiple MEMS elements; wherein the sensing comprises sensing the ultrasonic vibrations of each one of the multiple MEMS elements, during the detection period during which the MEMS speaker is not induced to vibrate by the control unit.

11. The method according to claim 7, comprising sending, by the MEMS speaker and when operating in the audio output mode, a shutter control signal for oscillating the shutter and sending a blind control signal for oscillating the blind.

12. The method according to claim 7, comprising receiving, by the control unit and when operating in the audio output mode, an input signal that represents the audio signal, and controlling one or more of the multiple MEMS elements based on the input signal.

* * * * *